United States Patent
Krenz-Baath (10) Patent No.: US 11,237,211 B2
(45) Date of Patent: Feb. 1, 2022

(54) MICROCHIP HAVING A PLURALITY OF RECONFIGURABLE TEST STRUCTURES

(71) Applicant: HOCHSCHULE HAMM-LIPPSTADT, Hamm (DE)

(72) Inventor: Rene Krenz-Baath, Hamm (DE)

(73) Assignee: Hochschule Hamm-Lippstadt, Hamm (DE)

( * ) Notice: Subject to any disclaimer, the term of this patent is extended or adjusted under 35 U.S.C. 154(b) by 0 days.

(21) Appl. No.: 16/646,161

(22) PCT Filed: Sep. 14, 2018

(86) PCT No.: PCT/EP2018/074898
§ 371 (c)(1),
(2) Date: Mar. 11, 2020

(87) PCT Pub. No.: WO2019/053196
PCT Pub. Date: Mar. 21, 2019

(65) Prior Publication Data
US 2020/0271723 A1    Aug. 27, 2020

(30) Foreign Application Priority Data
Sep. 15, 2017   (DE) .................... 10 2017 216 444.1

(51) Int. Cl.
*G01R 31/3185*  (2006.01)
*G01R 31/3181*  (2006.01)
*G01R 31/3183*  (2006.01)
*G06F 11/22*    (2006.01)
*G11C 29/56*    (2006.01)

(52) U.S. Cl.
CPC ........... *G01R 31/318563* (2013.01); *G01R 31/31813* (2013.01); *G01R 31/318335* (2013.01); *G06F 11/2205* (2013.01); *G11C 29/56* (2013.01)

(58) Field of Classification Search
CPC ...... G01R 31/318563; G01R 31/31813; G01R 31/318335; G01R 31/318547; G06F 11/2205; G11C 29/56
See application file for complete search history.

(56) References Cited

U.S. PATENT DOCUMENTS 8,533,546 B1   9/2013  Ferguson et al.
2002/0147950 A1*  10/2002  Whetsel ........... G01R 31/31855
                                                        714/726

(Continued)

OTHER PUBLICATIONS

International Search Report and Written Opinion issued in corresponding International Patent Application No. PCT/EP2018/074898 (with English translation of International Search Report) dated Dec. 5, 2018 (7 pages).

*Primary Examiner* — Cynthia Britt
(74) *Attorney, Agent, or Firm* — Kilyk & Bowersox, P.L.L.C.

(57) ABSTRACT

The invention relates to a microchip with a multiplicity of reconfigurable test structures, wherein the microchip has a test input (TDI) and a test output (TDO), wherein the multiplicity of test structures can be connected to the test input (TDI) and the test output (TDO), wherein one intermediate memory is provided for each of the multiplicity of test structures, wherein each of the multiplicity of test structures can be tested separately and concurrently with the aid of the respective intermediate memory and a corresponding individual control.

7 Claims, 7 Drawing Sheets

(56) References Cited

U.S. PATENT DOCUMENTS

| | | |
|---|---|---|
| 2004/0153921 A1 | 8/2004 | Lee et al. |
| 2005/0204226 A1* | 9/2005 | Whetsel ......... G01R 31/318563 714/726 |
| 2009/0193304 A1* | 7/2009 | Chakraborty .. G01R 31/318536 714/726 |
| 2013/0086441 A1 | 4/2013 | Yang et al. |

* cited by examiner

Test Structures (PRIOR ART)

MICROCHIP HAVING A PLURALITY OF RECONFIGURABLE TEST STRUCTURES

This application is a National Stage Application of PCT/EP2018/074898, filed Sep. 14, 2018, which claims priority to German Patent Application No. 10 2017 216 444.1, filed Sep. 15, 2017.

The invention relates to a microchip with a multiplicity of reconfigurable test structures.

BACKGROUND

It is known to equip microchips with test structures. These test structures make it possible to test microchips after production. In this case, tests may also relate to individual components of the microchip.

In hitherto-known test structures, test signals are applied via an access and conducted through all structures. Generally, only one test access is available, as the area available for accesses is limited. Consequently, this means that tests may take some time under certain circumstances if they are carried out with the required care.

It has been shown, however, that such tests are often only carried out inadequately, as they constitute a considerable time outlay. In addition, a high data volume is generated, which is likewise laborious in terms of analysis. Both together leads to an increased cost outlay in each case.

Such tests and test structures are only used during the production test (what is known as an in-production test) and make up a non-negligible portion, of up to 50% of the total costs.

At the same time, it is to be determined however, that in many fields, tests of microchips during operation (what are known as in-field tests) are also desirable or even normatively required.

For example, the standard ISO 26262 requires a rapid self test during operation (what is known as an in-field test).

The provision of such tests will become a requirement in particular in fields of autonomous control, such as e.g. autonomous driving, in order to ensure operational reliability and therefore also safety for others.

However, such in-field tests often require additional infrastructure and additional costs, as additional safety functions are to be taken into account for the test during continuous operation, as the actual operation/function of the microchip must not be impaired.

Typically, a microchip is considered as a design under test (or a plurality of designs under test). This design under test is provided with additional test structures, which provides options for controllability/observability independently of the actually available functionality of the microchip/the design under test.

To this end, generally a microchip is equipped with a test-data input TDI and a test data-output TDO and a test clock signal. The test clock signal may also be derived from other clock signals. Often, the test clock signal is lower than the maximum clock signals that are used on the microchip.

Memory cells are arranged between the test-data input TDI and the test-data output TDO, which can be understood as a FIFO (first in first out) chain between the test-data input TDI and the test-data output TDO.

In such an approach, a common test stimulus (only test data) for all elements is introduced via the test input TDI and cycled through the test structure and the output signal (processed test data) is read out at the test output TDO. This approach forms a fixed scan chain, i.e. the sequence of the tests or the structures to be tested is fixedly predetermined.

Figure 1:
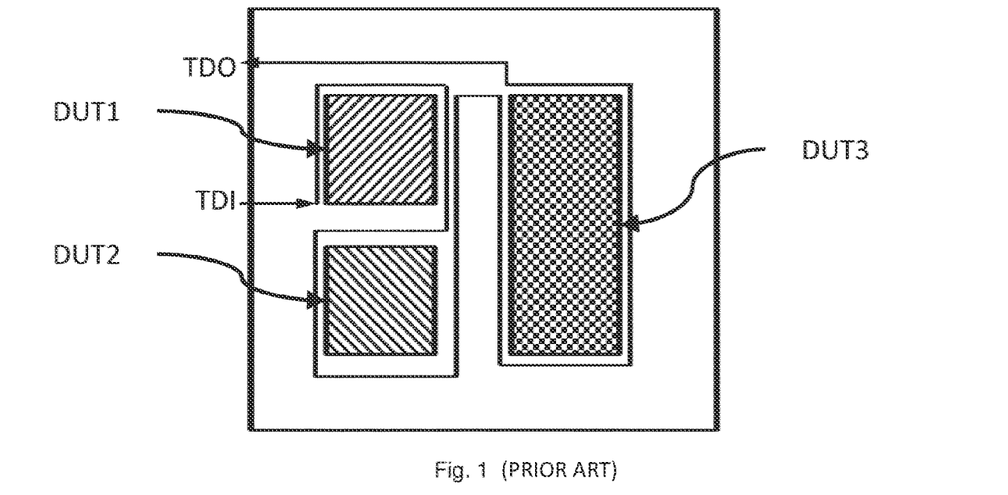
FIG. 1 shows a sectional overview of test structures according to the prior art.

One such exemplary scan chain is illustrated in FIG. 1. Here, a test stimulus introduced via TDI must initially run through the hatched test structure DUT1 from bottom left to top right, subsequently through the hatched test structure DUT2 from bottom right to top left, then run through the test structure DUT3, hatched in a chess-board-like manner, in order subsequently to appear, processed, at the test output TDO.

With the aid of this infrastructure, test data are introduced into the DUT and test results are simultaneously output via the TDO, generally in the form of a bit series, cf. FIG. 1. In complex DUTs, shift chains can often exceed a length of several thousand memory elements.

Several thousand test vectors are applied to these shift chains depending on the respective test mode, wherein each test vector consists of a bit sequence with a length equal to the length of the shift chain.

Test stimuli or test results are contained in the bit sequences sequentially input from TDI and output to TDO, respectively.

Such linear structures have proven to be inflexible, however, as the structure is only equipped with a uniform length of the test stimulus and without the option of test modes.

In order to get around this, what are known as configurable scan chains had already started to be suggested in the past. In these configurable scan chains, the test stimulus at the input side consists of test data and control data, using which a certain region of the test structure can be tested. These configurable scan chains allow a more flexible carrying out of the test and, e.g. in the case of a fault, a faster reaction time.

Figure 2:
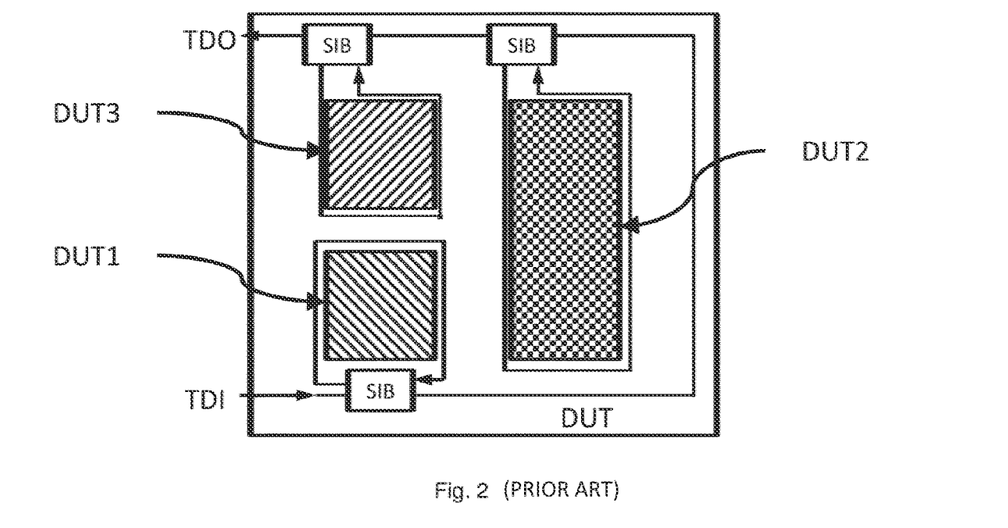
FIG. 2 shows a sectional overview of test structures according to the prior art.
Figure 3A:
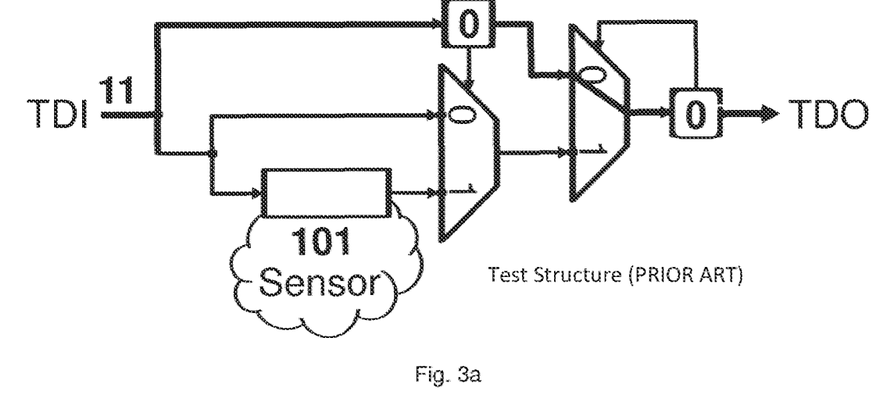
FIGS. 3a and 3b show schematic overviews of the signal path in a test structure according to the prior art in two successive configuration steps.

A configurable scan chain is clarified on the basis of the example of FIG. 2. Here, additional elements SIB are introduced, which make it possible to control certain structures of the design under test in a targeted manner. For example, if one wanted only to test the first structure DUT1 in an arrangement according to FIG. 1, the entire test would nonetheless have to be guided through DUT2 and DUT3 also. By contrast, in FIG. 3 the structure to be tested can be selected by means of e.g. a 3 bit control signal. For example, the structure DUT1 can be selected for a test by 100, whilst 101 selects the structures DUT1 and DUT3. The (subsequent) test stimulus is then forwarded to the selected structures, so that the testing is possible in a more flexible and therefore faster manner. one such procedure corresponds to IEEE 1687 inter alia/for example.

Figure 3B:
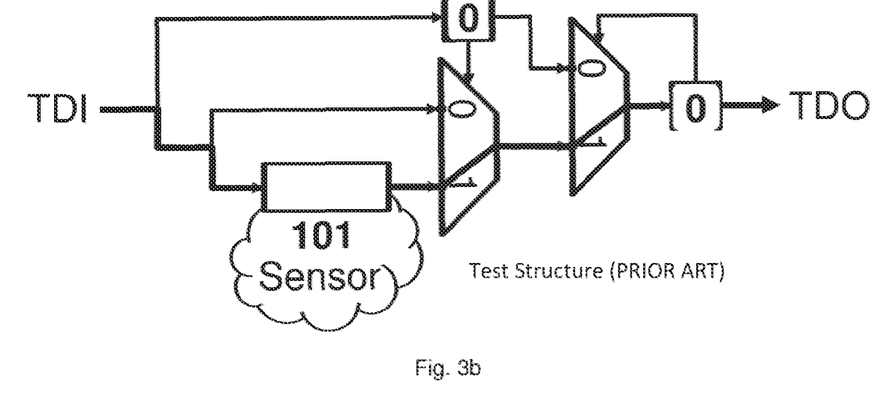

It has been shown however, that this approach is connected with considerable disadvantages in the case of large and/or complex test structures. On the one hand, if the design under test has a plurality of hierarchy levels and/or more complex control structures, a plurality of configuration cycles are required, in order to enable particular testing. Thus, the required test time also increases with each configuration cycle. Often, such tests of structures lying deeper in the hierarchy are therefore less well tested, in order to compensate the time disadvantage. One such example is shown in FIGS. 3a and 3b. In order to read out the datum of the sensor in the test structure shown, the upper branch with the bit sequence "00" must initially be selected in a first step. Then, by means of the bit sequence "11", the multiplexers can be activated in such a manner that in the following output steps, the sensor datum "101" is output from the output TDO by inputting corresponding values (part of the test stimulus) on the input TDI.

Figure 4:
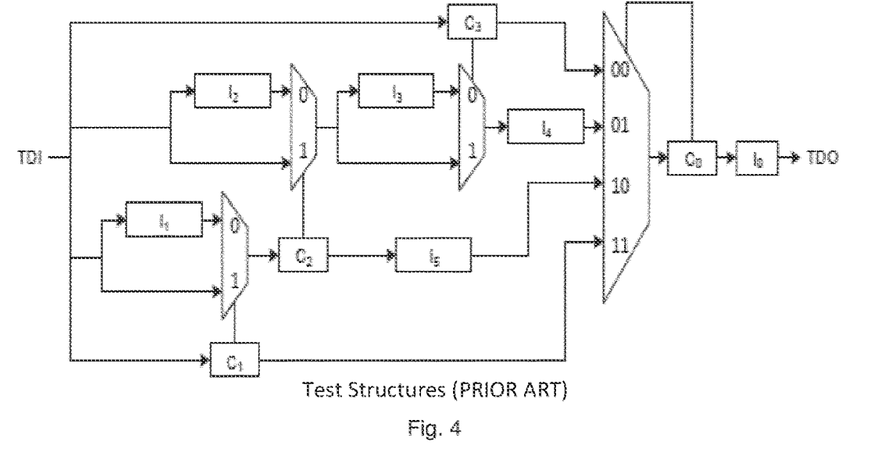
FIG. 4 shows a further schematic overview of test structures according to the prior art.

Furthermore, it is seen that, in the case of a plurality of hierarchies, the test structures may also have exclusory substructures, cf. FIG. 4 in this respect. Here, the test structures 14 and 15 can only be activated one after the other, i.e. at least one further configuration step is required. The likelihood of such exclusory test structures increases with complexity. In this respect, the flexibility is limited or leads to an increased complexity, as exclusory substructures often only become accessible by means of the insertion of additional hierarchy levels.

Object

On this basis, it is an object of the invention to provide a microchip with test structures, which solves one or more problems from the prior art or which enables both fast in-field and fast in-production tests.

BRIEF DESCRIPTION OF THE INVENTION

The object is achieved by means of a microchip with a multiplicity of reconfigurable test structures, wherein the microchip has a test input and a test output, wherein the multiplicity of test structures can be connected to the test input and the test output, wherein one intermediate memory is provided for each of the multiplicity of test structures, wherein each of the multiplicity of test structures can be tested separately and concurrently with the aid of the respective intermediate memory.

Further advantageous configurations are the subject of the dependent claims, the figures and the detailed description.

BRIEF DESCRIPTION OF THE FIGURES

The invention is described in more detail in the following, with reference to the figures. In the figures.

DETAILED DESCRIPTION

The invention is described in more detail in the following, with reference to the figure. Here, it is to be noted that different aspects are described, which can be used individually or in combination in each case. That is to say, any aspect can be used with different embodiments of the invention, insofar as it is not explicitly represented as a pure alternative.

Furthermore, in the following, for the sake of simplicity, reference is generally always only made to one entity. Insofar as not explicitly noted, the invention can however also have a plurality of the relevant entities in each case. In this respect, the use of the words "a", "an" and "one" is only to be understood as an indication that at least one entity is used in a single embodiment.

Embodiments of the invention are illustrated in FIGS. 5-11. In this case, a microchip according to the invention has a multiplicity of reconfigurable test structures DUT1, ... DUT4. The number of reconfigurable test structures is not limited and only exemplary with 4 test structures in individual figures.

The totality of the test structures are addressed via a common test input TDI and read out from a common test output TDO. That is to say, the microchip has a test input TDI and a test output TDO, wherein the multiplicity of test structures can be connected to the test input TDI and the test output TDO.

An intermediate memory CSU0 ... CSU3 is provided for each of the multiplicity of test structures. The size of the intermediate memory may be configured differently, depending on the test structure DUT1 ... DUT4.

Each of the number of test structures DUT1 ... DUT4 can then be tested separately as well as concurrently, with the aid of the respective intermediate memory CSU0 ... CSU3.

In this case, concurrently means that different, particularly exclusory, regions of the test infrastructure (e.g. $C_1$ and $C_2$ in FIG. 6) can be used independently of one another.

Figure 5:
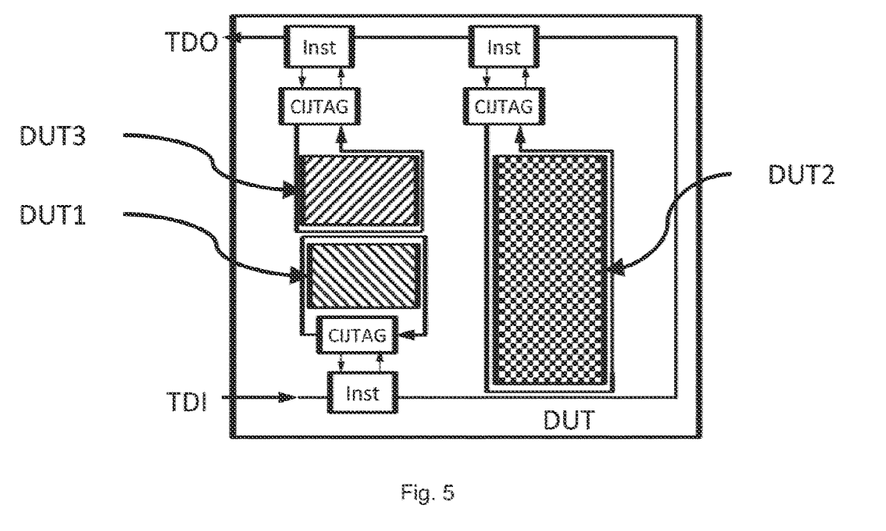
FIG. 5 shows a sectional overview of test structures according to embodiments of the invention.

For example, DUT3 should be tested in FIG. 5. DUT3 corresponds to C3 in the following figures. Then, DUT3, just like the other test structures DUT1, DUT2, is connected to a common test bus (from TDI to TDO). However, this connection is produced by means of an instrument—abbreviated INST. A CJTAG unit, which controls the actual test inside a structure DUT1 ... DUT3 to be tested, is located downstream of the instrument.

That is to say, the tests or the control of the test infrastructure can proceed independently, so that execution of a test in the structure DUT1 does not impair the configuration of a different test in a different test structure DUT2, DUT3, or whilst a test is executing, test results of one or more different structures can be read out. That is to say, in the invention, a logic shift to the structural level takes place, so that test/control data for a plurality of test sequences in the substructure can be loaded in a block.

However, the tests can also be instrumented in parallel. That is to say tests can be loaded in parallel by means of a suitable activation of the instruments.

Figure 11:
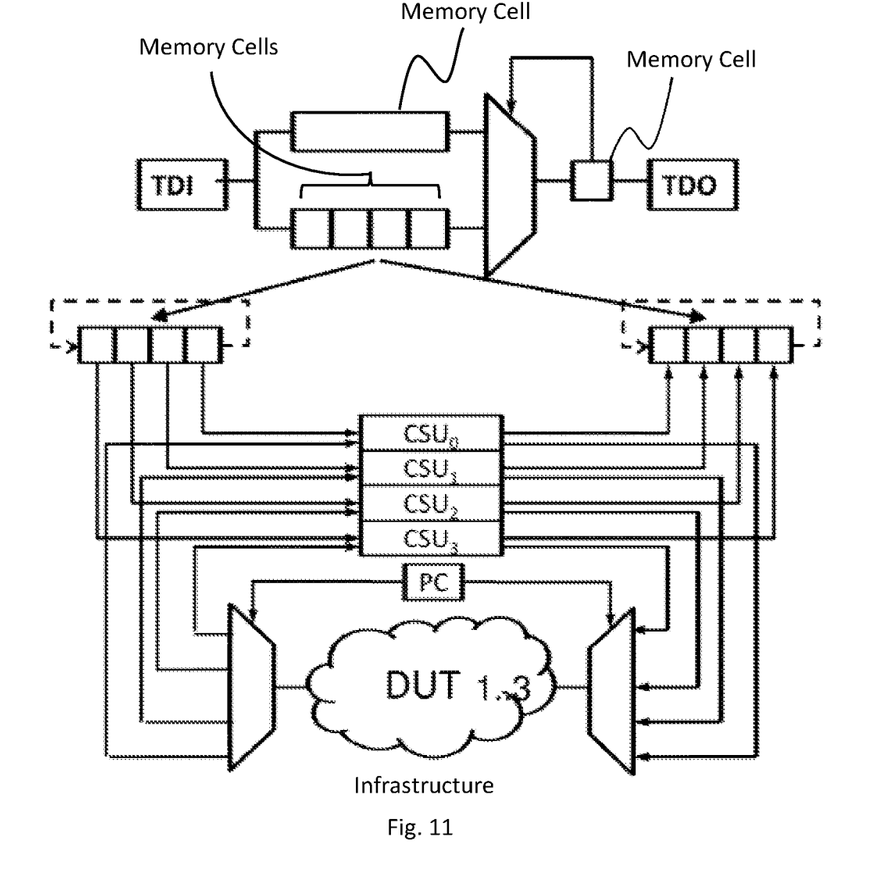
FIG. 11 shows schematic overviews according to embodiments of the invention.

An exemplary infrastructure is outlined in FIG. 11. Here, test stimuli and/or test results are stored in an intermediate memory CSU0 ... CSU3. Furthermore, a process counter PC may also additionally be provided for executing the test. In principle, the CIJTAG block (cf. FIG. 5) has the tasks of temporarily storing test data and test results, controlling test execution, (optional) test-data decompression and (optional) test-result compression within the respective test structure. Of course, the CIJTAG block can also take on further functions.

Figure 6:
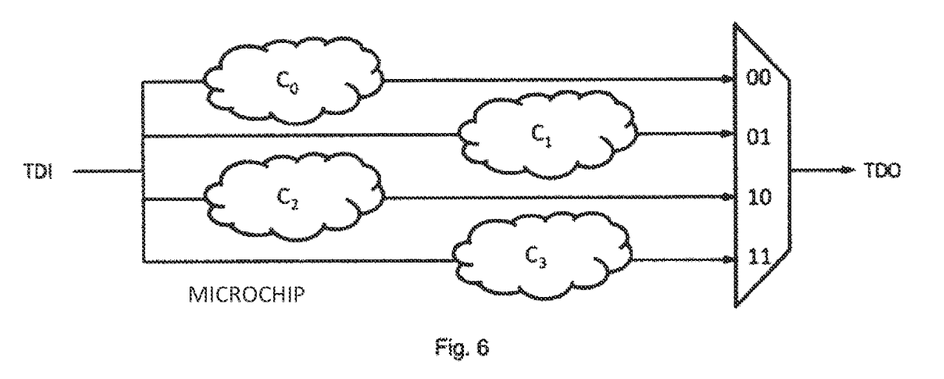
FIGS. 6 and 7 show an aspect according to embodiments of the invention.
Figure 7:
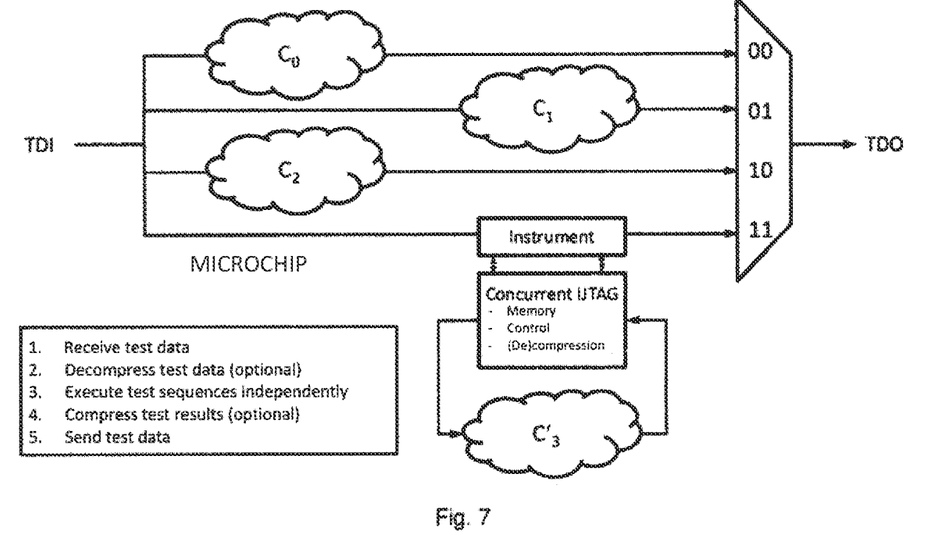

That is to say, if the structure C3 is to be tested in FIG. 6, then it is provided with test and control data. To this end, the instrument in FIG. 7 accepts the test data upon detecting the selection and provides the test data to the CIJTAG block. Received test data in turn contain control data for a test. If such control data are contained, then the CIJTATG block activates the test structure accordingly. Test stimulus or test stimuli, which are contained in the test data, are then executed by the CIJTAG block under control. Test results are collected by the CIJTAG block and, upon renewed activation, provided to the instrument and read out via the output TDO.

Figure 8:
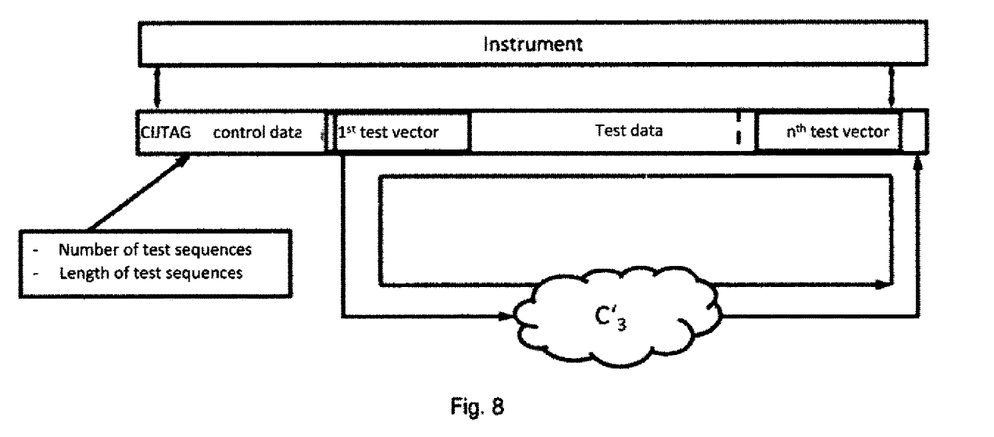
FIG. 8 shows a further aspect according to embodiments of the invention.

CIJTAG control data and test stimuli (what are known as test vectors) are contained in FIG. 8 by way of example. The CIJTAG control data may contain e.g. data relating to the number of test sequences and/or the length of the test sequences.

Figure 9:
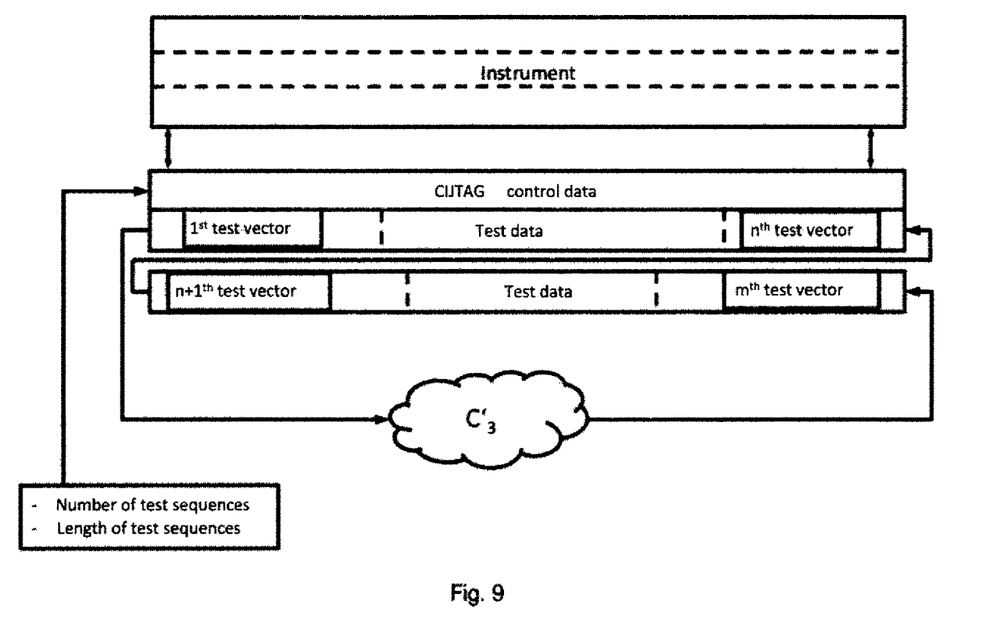
FIG. 9 shows another further aspect according to embodiments of the invention.

Without limiting generality, it may also be provided, as shown in FIG. 9, that a multi-bit bus is used, i.e. different tests (in the example one test with test vectors 1 . . . n and a different test with test vectors n+1 . . . m) are carried out.

Figure 10:
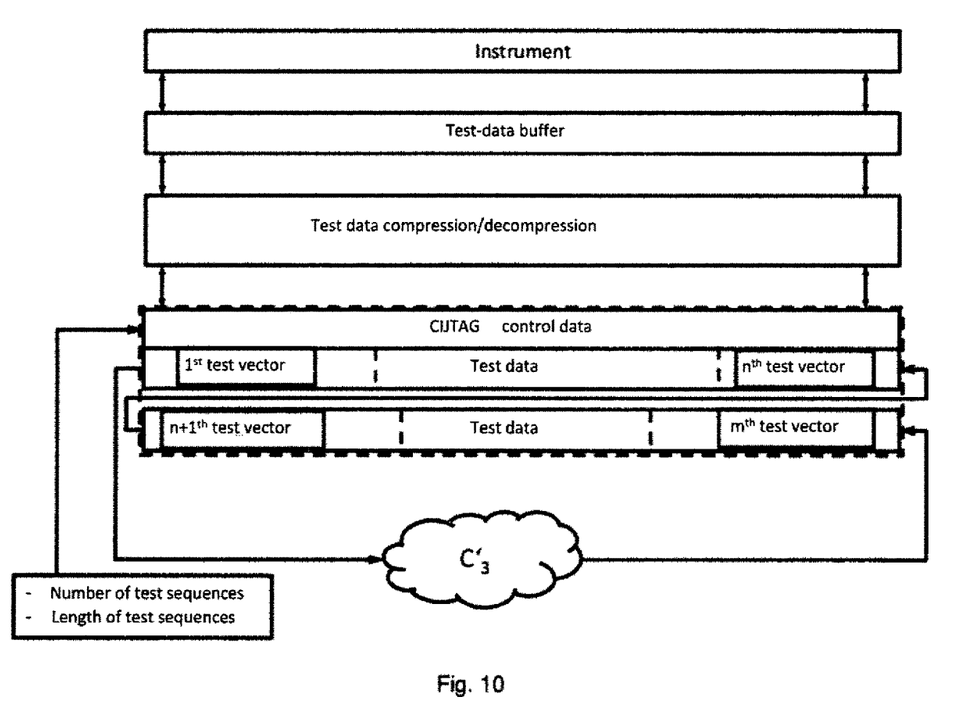
FIG. 10 shows schematic overviews according to embodiments of the invention.

Without limiting generality, it may be provided, as shown in FIG. 10, that test data are initially read into an intermediate memory/test-data buffer and are decompressed prior to execution. In this case, even only parts of the data can be compressed. For example, the control data may be uncompressed, whilst the test stimuli are compressed or vice versa.

In the same way, it may also be provided, however, that the test results are compressed before they are read out from the test-data buffer via the instrument and read out via the TDO.

Compression allows a reduction of the test-data quantity and thus time advantages during the transport of the data, so that can be configured in an accelerated manner and/or can be read out in an accelerated manner. The reduction is significant here in particular in that reading in and out of data takes place in many cases by means of an only 1-bit wide input TDI/output TDO. That is to say, whilst a test structure (de)compresses data, other test structures can be loaded/unloaded.

It is noted in this case, that the compression/decompression can also optionally be designed to be configurable. For example, whether and, if appropriate, which data are to be (de)compressed can be signalled by means of the control data.

Furthermore, it may be provided, that the test structure provides an in-field test.

In addition, it may readily be provided in embodiments of the invention, that at least a portion of the multiplicity of test structures can be tested simultaneously.

The invention makes it possible that concurrent and reconfigurable test infrastructures are possible for the in-production test. Compared to previous structures, the inventive test structures offer the possibility of testing components with a significantly lower time outlay/data outlay. As a result, in addition to the time saving achieved, the test quality can furthermore also be improved, as omitted tests can now take place within the previously required time.

This advantage is also of utmost importance in the case of structures on microchips, which are becoming more complex and, at the same time, smaller.

For in-field tests in particular, the invention allows the option of fulfilling the requirements of modern standards, such as e.g. ISO26262, which e.g. requires a self test in the range of milliseconds. Here, due to the concurrency, it is possible to control or carry out numerous test operations independently and simultaneously.

The invention claimed is:

1. A microchip comprising a multiplicity of reconfigurable test structures, wherein:
the microchip has a test input (TDI) and a test output (TDO); each reconfigurable test structure of the multiplicity of reconfigurable test structures is connected to the test input (TDI) and to the test output (TDO); the microchip comprises a plurality of intermediate blocks including a respective intermediate block provided for each of the reconfigurable test structures; each of the intermediate blocks comprises at least a memory and a control; each of the memories of the intermediate blocks is configured to store a respective test stimulus for the respective reconfigurable test structure; each of the controls of the intermediate blocks is configured to execute the respective test stimulus for the respective reconfigurable test structure; and each of the multiplicity of reconfigurable test structures is configured to be tested separately and concurrently with the aid of the respective intermediate block.

2. The microchip according to claim 1, wherein each of the respective intermediate blocks is configured to decompress the respective test stimulus prior to execution.

3. The microchip according to claim 1, wherein each of the respective intermediate blocks is configured to compress a result of the respective test stimulus prior to forwarding to the test output (TDO).

4. The microchip according to claim 1, wherein each of the reconfigurable test structures provides an in-field test.

5. The microchip according to claim 1, wherein at least a portion of the multiplicity of reconfigurable test structures is configured to be tested simultaneously.

6. The microchip according to claim 1, further comprising a plurality of instruments, wherein a respective instrument of the plurality of instruments is upstream of each of the respective intermediate blocks, wherein the plurality of instruments is configured to accept the respective test stimulus upon detection and provide the respective test stimulus to the respective intermediate block.

7. The microchip according to claim 1, wherein each of the respective intermediate blocks is configured to store a result of the respective test stimulus in the respective memory prior to forwarding to the test output (TDO).

* * * * *